United States Patent
Wang et al.

(10) Patent No.: US 8,709,940 B2
(45) Date of Patent: Apr. 29, 2014

(54) STRUCTURE OF CIRCUIT BOARD AND METHOD FOR FABRICATING THE SAME

(75) Inventors: Shing-Ru Wang, Taoyuan (TW);
Hsien-Shou Wang, Taoyuan (TW);
Shih-Ping Hsu, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 472 days.

(21) Appl. No.: 13/046,441

(22) Filed: Mar. 11, 2011

(65) Prior Publication Data
US 2011/0154664 A1 Jun. 30, 2011

Related U.S. Application Data

(62) Division of application No. 11/588,911, filed on Oct. 27, 2006, now Pat. No. 7,906,850.

(30) Foreign Application Priority Data

Dec. 20, 2005 (TW) .............................. 94145205 A (51) Int. Cl.
*H01L 21/4763* (2006.01)

(52) U.S. Cl.
USPC .... 438/629; 438/108; 438/622; 257/E23.174; 257/774

(58) Field of Classification Search
USPC .................. 257/E23.178, E21.514, E23.021, 257/E21.504, E23.101, E23.089, 723, 786, 257/692, 738, 712, 778, 777, 774, 700; 438/108, 109, 622, 629, 637; 428/447, 428/174; 29/846
See application file for complete search history.

(56) References Cited

U.S. PATENT DOCUMENTS

| | | | |
|---|---|---|---|
| 5,557,844 A * | 9/1996 | Bhatt et al. ...................... | 29/852 |
| 5,627,406 A | 5/1997 | Pace | |
| 6,083,340 A * | 7/2000 | Nomura et al. ............... | 156/253 |
| 6,201,300 B1 * | 3/2001 | Tseng et al. ................... | 257/706 |
| 6,467,160 B1 * | 10/2002 | Cummings et al. ............ | 29/831 |
| 6,521,844 B1 * | 2/2003 | Fuerniss et al. ............... | 174/258 |
| 6,618,940 B2 * | 9/2003 | Lubert et al. ................... | 29/846 |
| 6,740,965 B2 | 5/2004 | Hsu et al. | |
| 6,764,931 B2 | 7/2004 | Iijima et al. | |
| 6,897,544 B2 | 5/2005 | Ooi et al. | |
| 6,914,322 B2 | 7/2005 | Iijima et al. | |
| 6,921,977 B2 | 7/2005 | Shimizu et al. | |
| 6,943,442 B2 | 9/2005 | Sunohara et al. | |
| 7,301,108 B2 * | 11/2007 | Egitto et al. ................... | 174/262 |
| 7,361,849 B2 * | 4/2008 | Asai et al. ....................... | 174/262 |
| 7,504,719 B2 * | 3/2009 | En et al. ......................... | 257/700 |
| 7,615,162 B2 * | 11/2009 | Asai et al. ......................... | 216/13 |
| 8,115,111 B2 * | 2/2012 | Shirai et al. .................... | 174/262 |
| 2005/0052822 A1 | 3/2005 | Shimizu et al. | |

* cited by examiner

*Primary Examiner* — Chris Chu
(74) *Attorney, Agent, or Firm* — Sawyer Law Group, P.C.

(57) ABSTRACT

A circuit board structure and a method for fabricating the same are proposed. The structure includes an insulating protective layer having a plurality of openings in which conductive vias are formed, a patterned circuit layer formed on the surface of the insulating protective layer and electrically connected to the conductive vias in the openings of the insulating protective layer, and a dielectric layer formed on the insulating protective layer and on the surface of the patterned circuit layer, wherein a plurality of openings are formed in the dielectric layer to thereby expose parts of the patterned circuit layer. Accordingly, the present invention reduces the thickness of a circuit board, which reduces package size, improves product performance, and conforms to the developmental trend toward smaller electronic devices.

17 Claims, 8 Drawing Sheets

STRUCTURE OF CIRCUIT BOARD AND METHOD FOR FABRICATING THE SAME

CROSS-REFERENCE TO RELATED APPLICATIONS

Under 35 U.S.C. 120, this application is a divisional application and claims priority to U.S. application Ser. No. 11/588,911, filed Oct. 27, 2006, which claims priority to Taiwan application no. 094145205, filed Dec. 20, 2005.

FIELD OF THE INVENTION

The present invention is related to circuit board structures and methods for fabricating the same, and more particularly, to a circuit board structure without a core layer and a method for fabricating the same.

BACKGROUND OF THE INVENTION

As the semiconductor packaging technology advances, different forms of packaging have been developed for semiconductor devices. For the traditional semiconductor devices, a semiconductor component, such as an integrated circuit, is firstly installed on a package substrate or a lead frame, then it is electrically connected to the package substrate or the lead frame, followed by encapsulation. The BGA (ball grid array) technique, such as PBGA, EBGA, and FCBGA, is one of the most advanced semiconductor packaging techniques. It is characterized by the installation of semiconductor components on a package substrate, and the back of the package substrate is implanted with many solder balls arrayed in a grid by the method of self-alignment, so that the same unit area of a carrier board for the semiconductor component can admit more I/O connections to suffice the demand for high integration of a semiconductor chip; the solder balls allow the entire package unit to be soldered together and electrically connected to the external devices.

Additionally, in order to meet the requirements for the computing of highly efficient chips like a microprocessor, a chipset, and a graphic chip, functions of circuit boards with wiring, such as signal transmission, bandwidth improvement, and resistive control, have to be improved so as to develop a package with higher I/O connections. However, the circuit boards for packaging semiconductor chips are presently equipped with thin wiring and small openings to meet the developmental trend of miniaturization, multi-function, high speed, and high frequency. The critical dimensions, including line width, line space, and aspect ratio, in the current circuit board production has been reduced from traditional size of 100 μm to 30 μm. More efforts are still being invested in the development for the precision of even thinner circuit wiring.

To enhance the wiring precision required for the circuit boards of semiconductor chip packaging, the semiconductor industry has developed a build-up technique, by which the surface of the core circuit board is stacked with a succession of a plurality of dielectric layers and circuit layers, and conductive vias are formed in the dielectric layers to thereby electrically connect the upper and lower circuit layers; wherein the build-up process is crucial to the circuit density of a circuit board.

Figure 1A:
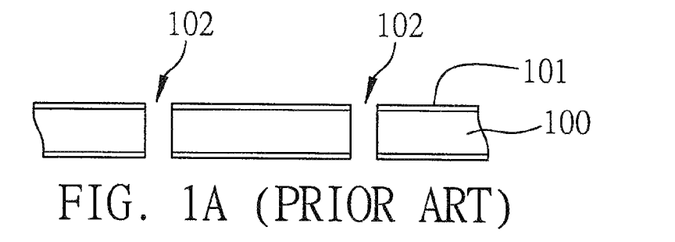
FIGS. 1A to 1H (PRIOR ART) are cross-sectional views showing the method for producing conventional circuit boards with built-up layers according to the prior art.
Figure 1B:
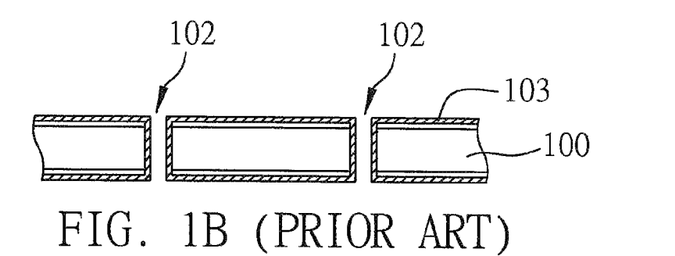
Figure 1C:
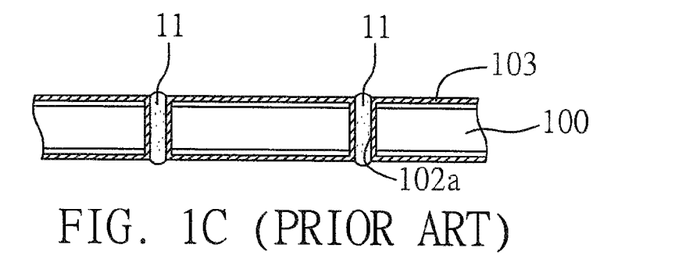
Figure 1D:
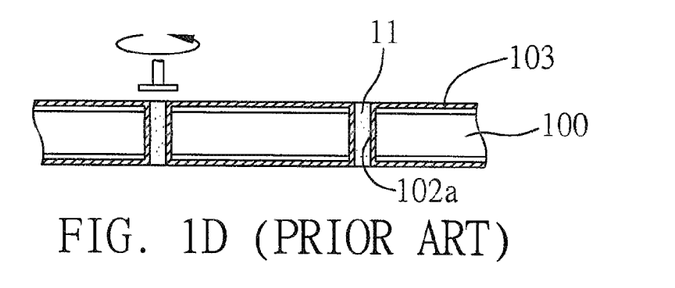
Figure 1E:
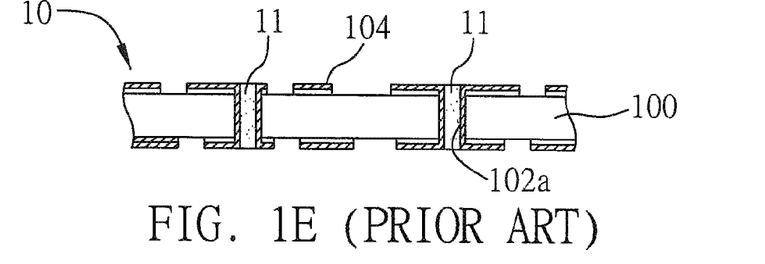

FIGS. 1A to 1H show a conventional method for fabricating a built-up circuit board. First of all, as shown in FIG. 1A, a core board 1 comprising an insulating layer 100 and a thin metal layer 101, such as a resin coated copper (RCC), is provided, then a plurality of through holes 102 are formed in the core board 1. As shown in FIG. 1B, another metal layer 103 is formed on the surface of the core board 1 and on the inner wall of the through holes 102 by a copper electroplating process. As shown in FIG. 1C, a conductive or non-conductive hole-plugging material 11 (such as insulating ink or conductive paste that contains copper) fills the remaining spaces left in through holes 102, so that plated through holes (PTH) 102a are formed for electrically connecting the metal layer 103 on the top and bottom surfaces of the insulating layer 100. As shown in FIG. 1D, a redundant portion of the hole-plugging material 11 is removed by a scrubbing process to keep the surface of the circuits in the core board 1 even and flat. As shown in FIG. 1E, the copper foil on both sides of the insulating layer 100 and the metal layer 103 are patterned to fabricate a finished core circuit board 10 having an inner circuit layer 104 on both sides.

Figure 1F:
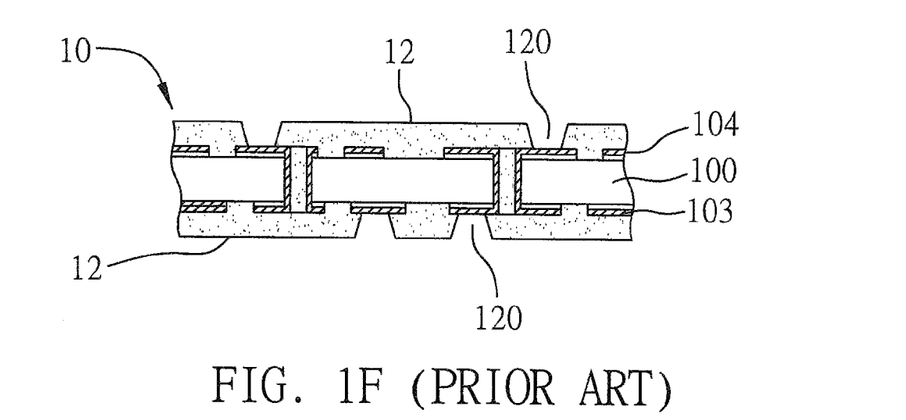
Figure 1G:
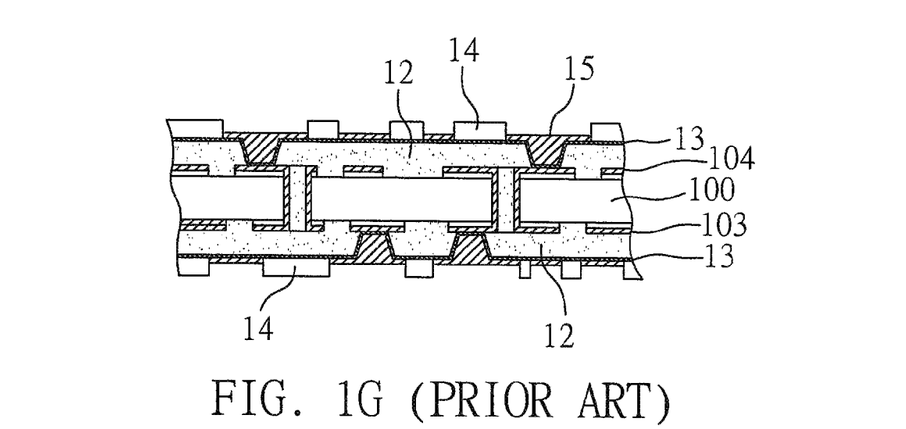
Figure 1H:
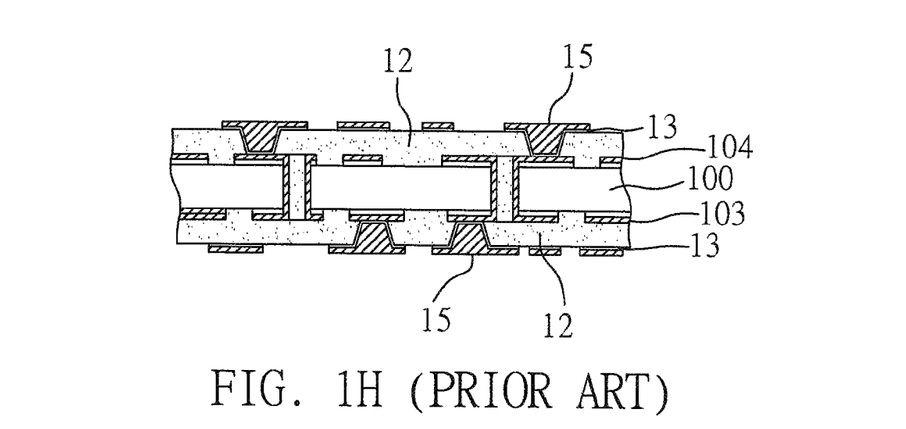

Subsequently, as shown in FIG. 1F, a dielectric layer 12 is formed on the inner circuit layer 104 on the upper and lower surfaces of the core circuit board 10; a plurality of openings 120 are formed in the dielectric layer 12 by laser ablation. Then, as shown in FIG. 1G, after a conductive layer 13 is formed on the surface of the dielectric layer 12 and the openings 120 by electroless plating, a patterned resistive layer 14 is formed on the conductive layer 13, so as to form a circuit layer 15. As shown in FIG. 1H, the patterned resistive layer 14 is removed and etching is carried out, thereby removing the conductive layer 13 underneath the patterned resistive layer 14. The above process is repeated to form dielectric layers and built-up circuit layers with a view to fabricating a circuit board having multiple circuit layers.

However, in the process described above, an insulating layer covered with thin metal layers is used as the core, and a core circuit board is formed subsequently by forming circuits on the core, followed by the build-up process performed on the core circuit board, so as to fabricate a multi-layer circuit board that meets the required electrical requirements. As a result, the thickness of the finished multi-layer circuit board cannot be reduced, which is unfavorable to the developmental trend of a miniaturized semiconductor package structure. If the thickness of the core is reduced to as thin as 60 μm or less, the production of the multi-layer circuit board will be seriously compromised, and the production yield of circuit boards will decrease significantly.

In addition, there are extra steps in the production of core circuit boards, such as the hole-plugging and the scrubbing, which increase the production cost. More importantly, it is necessary to form a plurality of PTHs in the core circuit board; the diameter of a typical through hole formed by drilling is approximately 100 μm or more, while the diameter of the conductive via (laser blind hole) is approximately 50 μm. By comparison, the process of PTHs makes it more difficult to form a structure with finer circuits.

Moreover, in the process of the multi-layer circuit board described above, it is necessary to fabricate a core circuit board prior to forming dielectric layers and circuit layers, which consequently complicates the production steps, prolongs the process, and increases the production cost.

As a result, the industry urgently needs a solution to providing a circuit board structure and a method for fabricating the same, so as to overcome the drawbacks of the prior art, such as increased thickness of circuit boards, low wiring density, low yield, complicated production steps, a lengthy process, and a high production cost.

SUMMARY OF THE INVENTION

In light of the shortcomings of the prior art described above, the primary objective of the present invention is to provide a circuit board structure and a method for fabricating the same so as to reduce the thickness of a circuit board and thereby meet the developmental trend toward miniaturization.

Another objective of the present invention is to provide a circuit board structure and a method for fabricating the same so as to increase the wiring density of the circuit board.

A further objective of the present invention is to provide a circuit board structure and a method for fabricating the same so as to simplify production steps, raise yield, shorten production time, and reduce production cost.

To achieve the above and other objectives, the present invention discloses a method for fabricating a circuit board structure, which includes: providing a carrier board made of metal; forming an insulating protective layer on one surface of the carrier board, and forming a plurality of openings in the insulating protective layer to thereby expose parts of the carrier board; forming a circuit structure on the surface of the insulating protective layer and in the openings; forming a dielectric layer on the insulating protective layer and the circuit structure, and forming openings in the dielectric layer to thereby expose parts of the circuit structure; and forming a built-up structure and then removing the carrier board, so as to fabricate a circuit board structure.

The present invention also discloses a circuit board structure comprising: an insulating protective layer having a plurality of openings in which conductive vias are formed; a patterned circuit layer formed on one surface of the insulating protective layer and electrically connected to the conductive vias in the openings of the insulating protective layer; and a dielectric layer formed on the insulating protective layer and on the surface of the patterned circuit layer, wherein a plurality of openings are formed in the dielectric layer to thereby expose parts of the patterned circuit layer.

In comparison with the prior art, the present invention discloses a circuit board structure and a method for fabricating the circuit board structure to effectively decrease the thickness of the circuit board, reduce package product size, and enhance electrical functionality. Therefore, the present invention is in line with the trend toward miniaturization of electronic products, and eliminate disadvantages of the prior art, like thick packages and bulky finished package products.

BRIEF DESCRIPTION OF THE DRAWINGS

The present invention can be more fully comprehended by reading the following detailed description of the preferred embodiments, with reference to the accompanying drawings, wherein:

FIG. 2A' is another cross-sectional view showing the carrier board which is a metal layer with an insulating board attached to one surface thereof, in the method of the first embodiment;

FIG. 3A' is another cross-sectional view showing the carrier board which is a metal layer with an insulating board attached to one surface thereof, in the method of the second embodiment.

DETAILED DESCRIPTION

Preferred embodiments of the present invention are described in detail below while referring to FIGS. 2A to 2F', and FIGS. 3A to 3F'.

First Embodiment

FIGS. 2A to 2F' are cross-sectional views showing the method in accordance with the first embodiment of the present invention.

Figure 2A:
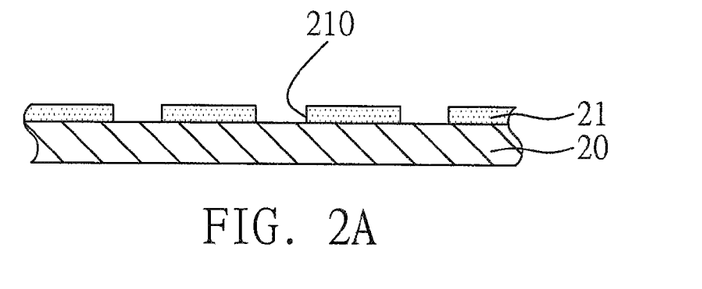
FIGS. 2A to 2F' are cross-sectional views showing the method in accordance with a first embodiment of the present invention.

As shown in FIG. 2A, a carrier board 20 is provided at first; the carrier board 20 is made of metal, preferably of copper, but is not limited to it. Then an insulating protective layer 21 made of a photosensitive dielectric material or a solder mask layer is formed on the carrier board 20, and a plurality of openings 210 are formed in the insulating protective layer 21 to thereby expose parts of the carrier board 20.

Figure 2B:
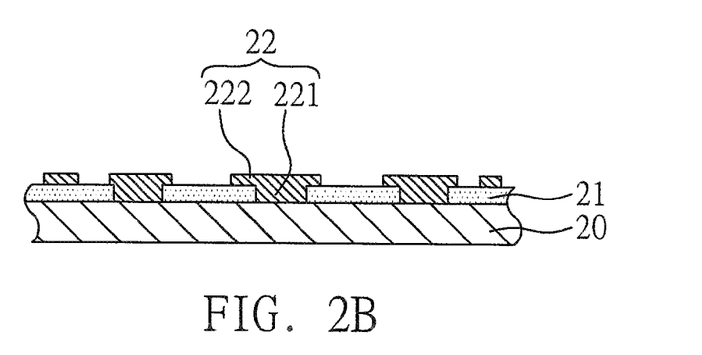

As shown in FIG. 2B, the carrier board 20 serves as a conductive pathway for forming a circuit structure 22 by electroplating. At first, a seed layer (not shown) is formed on the surface of the insulating protective layer 21 and the openings 210 by electroless plating. Then, a metal layer (not shown) and conductive vias 221 are formed by electroplating. Lastly, a patterned circuit layer 222 is formed by photolithography and etching.

Another method for fabricating the circuit structure 22 is disclosed. At first, a seed layer (not shown) is formed on the surface of the insulating protective layer 21 and the openings 210 by electroless plating. Then, a patterned resistive layer (not shown) is formed on the seed layer. Lastly, the patterned circuit layer 222 and the conductive vias 221 are formed by electroplating. Related details are not described further herein.

Figure 2C:
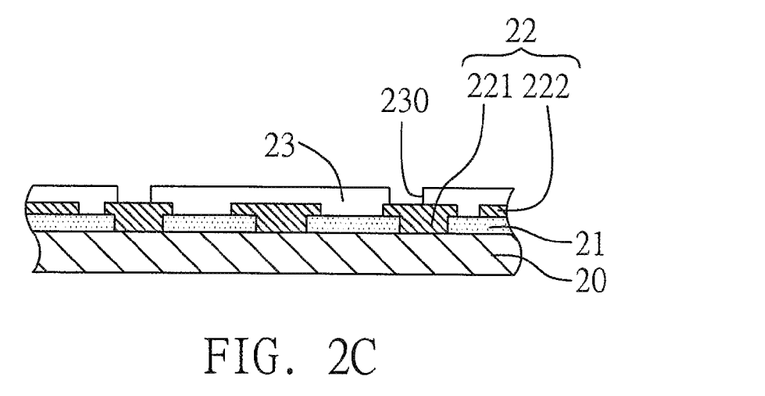

As shown in FIG. 2C, the method further involves forming a dielectric layer 23 on the insulating protective layer 21 and the circuit structure 22, and forming a plurality of openings 230 in the dielectric layer 23, such that parts of the patterned circuit layer 222 are exposed. The dielectric layer 23 can be a combination of organic film made of dielectric materials or liquid organic resin materials, which can be photosensitive or non-photosensitive organic resins like ABF (Ajinomoto Build-up Film), BCB (Benzocyclo-buthene), LCP (Liquid Crystal Polymer), PI (Poly-imide), PPE (Poly(phenylene ether)), PTFE (Poly(tetra-fluoroethylene)), FR4, FR5, BT (Bismaleimide Triazine), or Aramide, or can be made of the materials that has been mixed with epoxy resin and glass fiber. Thus a fundamental circuit board structure is constructed, and thereby to suffice the requirements for different types of assembly.

Figure 2D:
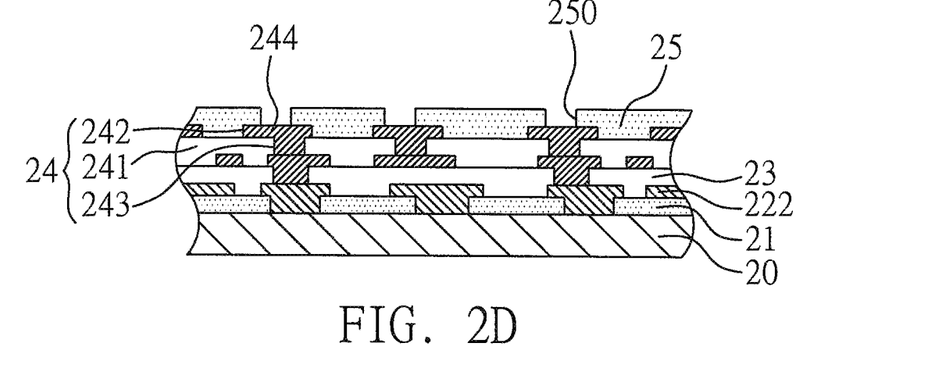

As shown in FIG. 2D, a built-up structure 24 is formed on the dielectric layer 23. The built-up structure 24 comprises at least one dielectric layer 241, at least one circuit layer 242 stacked on the dielectric layer 241, a plurality of connecting pads 244, and a plurality of conductive vias 243 formed in the dielectric layer 241. The conductive vias 243 electrically connect to the patterned circuit layer 222. In addition, another insulating protective layer 25 is formed on the surface of the built-up structure 24, and a plurality of openings 250 are formed in the insulating protective layer 25, so as to expose the connecting pads 244 of the built-up structure 24. The connecting pads 244 can be mounted with conductive elements (not shown) like conductive bumps or metal wires, to thereby electrically connect to the semiconductor components (not shown).

Figure 2E:
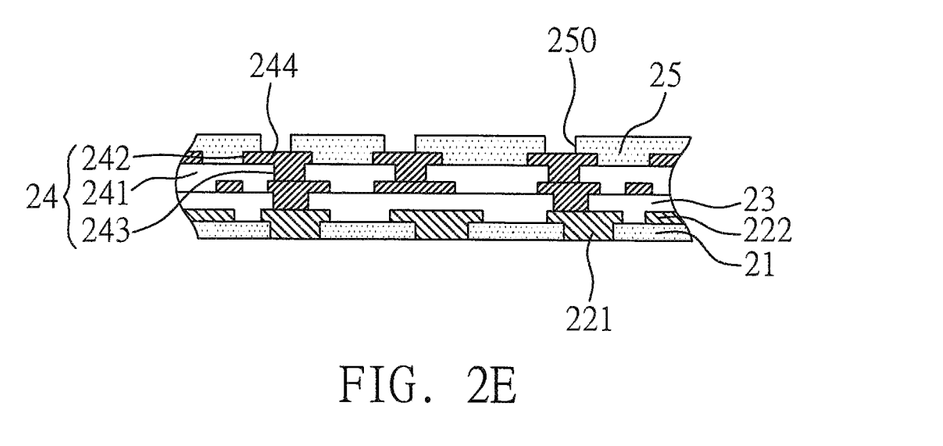
Figure 2F:
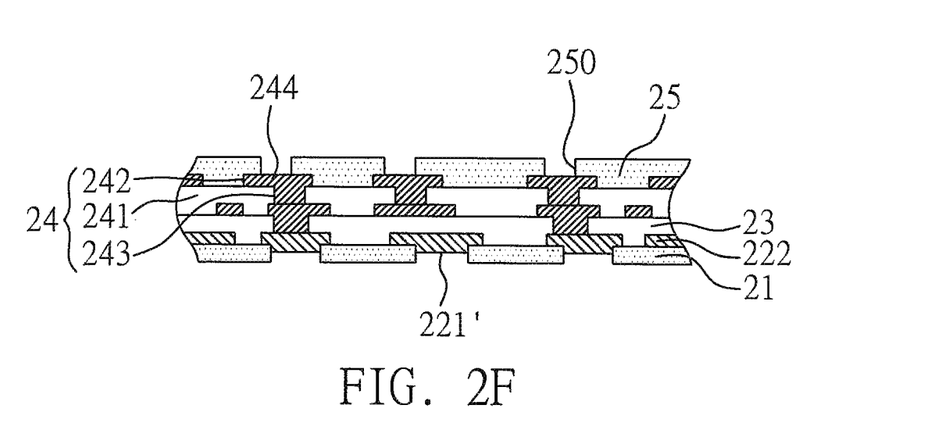

As shown in FIG. 2E, the carrier board 20 is then removed by chemical etching to expose the bottom surfaces of the conductive vias 221, which are likewise etched then, so that a slight sinking structure 221' is formed, as shown in FIG. 2F. Alternatively, the carrier board 20 can undergo a patterning process, such as photolithography and etching, or SAP electroplating is performed after the carrier board 20 has been removed, to form a bump 20' on the bottom surface of each of the conductive vias 221, and the bump 20' protrudes outwards from the surface of the insulating protective layer 21, as shown in FIG. 2F'.

Furthermore, an attachment layer is formed (not shown) on the surface of the bump 20', which is made of tin, lead, nickel, palladium, silver, gold, a metal alloy thereof, or a multi-layer metal made of tin/lead, nickel/gold, nickel/palladium/gold, or organic solderability preservatives (OSP); different materials can be used as appropriate.

As shown in FIG. 2A', the carrier board 20 made of metal further comprises an insulating board 201 attached to the other surface of the carrier board 20, which is opposite the surface with the insulating protective layer 21 formed thereon. Then the following steps are like the foregoing, as shown in FIGS. 2A to 2F'. The difference is that prior to the removal of the carrier board 20, the insulating board 201 attached to the carrier board 20 is removed by chemical or physical methods.

Second Embodiment

FIGS. 3A to 3F' are cross-sectional views showing the method of the present invention in accordance with the second embodiment. Unlike the first embodiment, the second embodiment discloses forming conductive vias 32 and a patterned circuit layer 33 in turn rather than at the same time.

Figure 3A:
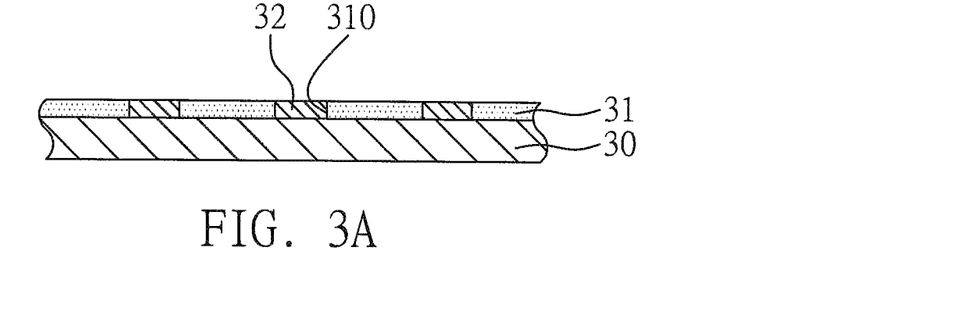
FIGS. 3A to 3F' are cross-sectional views showing the method in accordance with a second embodiment of the present invention.

As shown in FIG. 3A, the method further involves providing a carrier board 30 made of metal, forming an insulating protective layer 31 on the carrier board 30, forming a plurality of openings 310 in the insulating protective layer 31 to thereby expose the carrier board 30, and forming the conductive vias 32 in the openings 310 of the insulating protective layer 31.

Figure 3B:
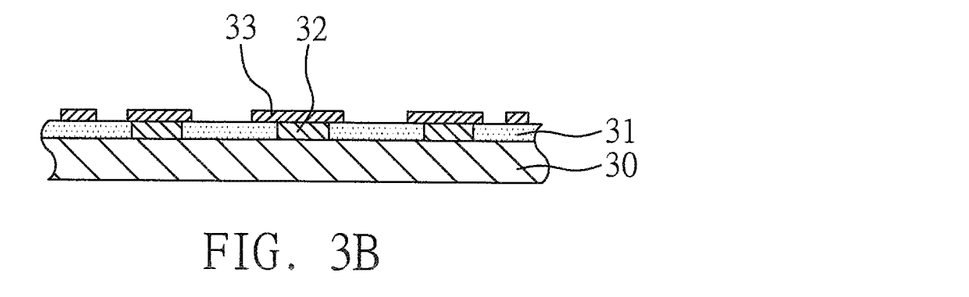
Figure 3C:
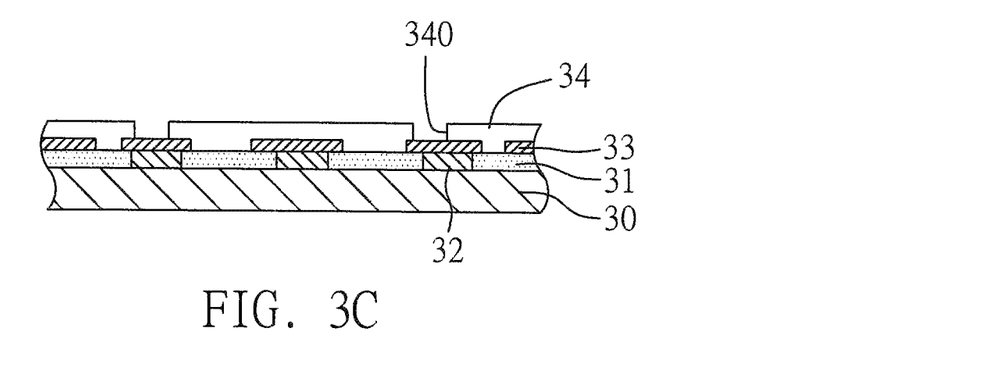
Figure 3D:
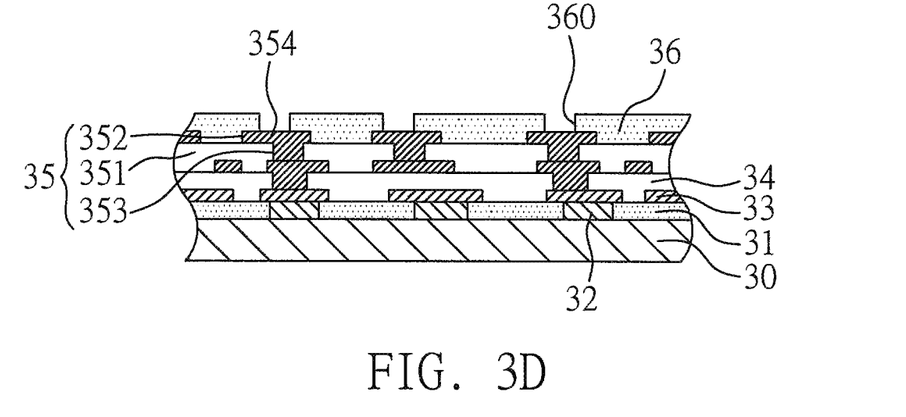
Figure 3E:
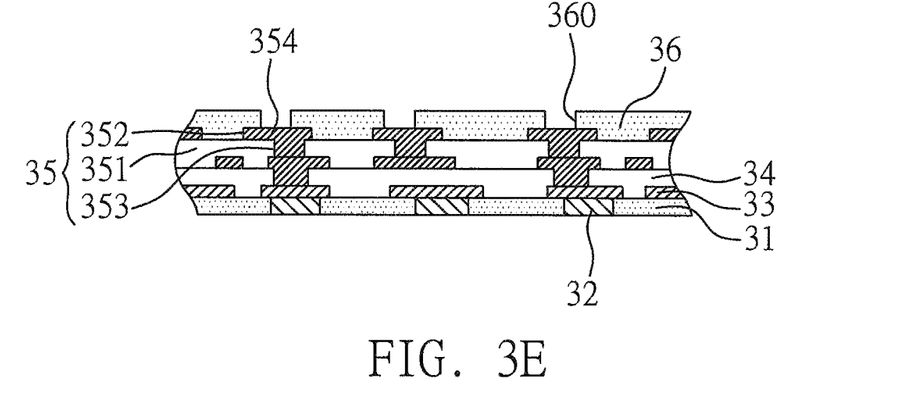
Figure 3F:
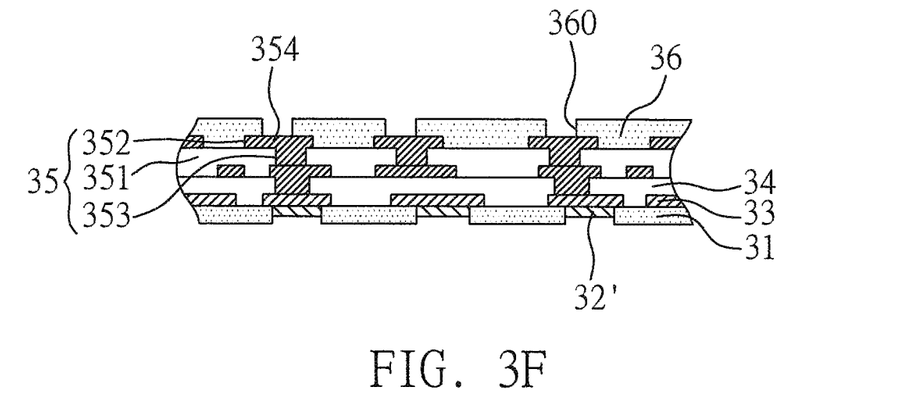

As shown in FIG. 3B, the method further involves forming the patterned circuit layer 33 on top surfaces of the conductive vias 32 and on the insulating protective layer 31, and connecting electrically parts of the patterned circuit layer 33 to the conductive vias 32. Prior to forming the patterned circuit layer 33, a seed layer (not shown) is formed on the surface of the insulating protective layer 31 and on the top surfaces of the conductive vias 32. The seed layer is a conductive pathway for electricity. A patterned resistive layer (not shown) is formed on the seed layer, to thereby form the patterned circuit layer 33 by electroplating, wherein related details are not described further herein. Or the patterned circuit layer 33 is formed by electroplating the seed layer to form a metal layer first, followed by a patterning process like photolithography and etching.

As shown in FIGS. 3C to 3F', the following steps are the same as the foregoing as shown in FIGS. 2C to 2F', wherein related details are not described further herein. The illustration of FIG. 3A' is understood by referring to FIG. 2A'.

The present invention also discloses a circuit board structure comprising an insulating protective layer 21 having a plurality of openings 210, a conductive via 221 formed in each of the openings 210, a patterned circuit layer 222 formed on a surface of the insulating protective layer 21 and electrically connected to the conductive vias 221, and a dielectric layer 23 formed on the surface of the insulating protective layer 21 and the patterned circuit layer 222, wherein a plurality of openings 230 are formed in the dielectric layer 23 to thereby expose parts of the patterned circuit layer 222, as shown in FIG. 2E. The bottom surface of each of the conductive vias 221 can be further etched to make a slight sinking structure 221', as shown in FIG. 2F, or a patterning process is carried out to form a bump 20' on the bottom surface of each of the conductive vias 221, and the bump 20' protrudes outwards from the surface of the insulating protective layer 21, as shown in FIG. 2F'.

Therefore, according to the circuit board structure of the present invention and the method for fabricating the same, a circuit board without a core can be fabricated, which effectively reduces the thickness of the circuit board, and facilitates the shrinkage of size for the package product and enhancement of electrical functionality, thereby sufficing the developmental trend toward miniaturization of electronic products.

Moreover, the circuit board structure of the present invention does not require PTHs for electrical connections between the circuits of each layer, which is accomplished through the conductive vias formed in the dielectric layer; thus the wiring density on the surface of the circuit board can be improved.

While the preferred embodiments of the present invention have been described, it is to be understood that modifications will be apparent to those skill in the art without departing from the spirit of the invention. The scope of the invention, therefore, is to be determined solely by the following claims.

What is claimed is:

1. A method for fabricating a circuit board structure comprising:
   providing a carrier board made of metal;
   forming an insulating protective layer on one surface of the carrier board, and forming a plurality of openings in the insulating protective layer to thereby expose parts of the carrier board;
   forming a circuit structure on the surface of the insulating protective layer and in the openings; and
   forming a dielectric layer on the insulating protective layer and the circuit structure, and forming openings in the dielectric layer to thereby expose parts of the circuit structure.

2. The method of claim 1, further comprising attaching an insulating board to the other surface of the carrier board prior to forming the insulating protective layer on the one surface of the carrier board.

3. The method of claim 1, wherein the circuit structure comprises a patterned circuit layer and conductive vias, the patterned circuit layer formed on the surface of the insulating protective layer, and the conductive vias formed in the openings of the insulating protective layer.

4. The method of claim 3, wherein the circuit structure is fabricated by the steps of forming a seed layer by electroless plating, electroplating the insulating protective layer to form a metal layer and the conductive vias, and forming the patterned circuit layer by photolithography and etching.

5. The method of claim 3, wherein the circuit structure is fabricated by the steps of forming a seed layer by electroless plating, forming a patterned resistive layer on the seed layer, and forming the patterned circuit layer and the conductive vias by electroplating.

6. The method of claim 3, wherein the bottom surface of each of the conductive vias is etched after the carrier board has been removed, so as to form a slight sinking structure.

7. The method of claim 3, further comprising forming a bump on the bottom surface of each of the conductive vias by a patterning process.

8. The method of claim 1, further comprising forming a built-up structure on the dielectric layer, the built-up structure comprising at least one dielectric layer, at least one built-up circuit layer, a plurality of connecting pads, and a plurality of conductive vias electrically connected to the patterned circuit layer.

9. The method of claim 8, further comprising forming another insulating protective layer on a surface of the built-up structure, and forming a plurality of openings in the insulating protective layer, to thereby expose the connecting pads of the built-up structure.

10. A method for fabricating a circuit board structure comprising:
   providing a carrier board made of metal;
   forming an insulating protective layer on one surface of the carrier board, and forming a plurality of openings in the insulating protective layer to thereby expose parts of the carrier board;
   forming a conductive via in each of the openings of the insulating protective layer;
   forming a patterned circuit layer on the surface of the insulating protective layer and top surfaces of the conductive vias such that the patterned circuit layer is electrically connected to the conductive vias; and
   forming a dielectric layer on the insulating protective layer and the patterned circuit layer, wherein openings are formed in the dielectric layer to thereby expose parts of the patterned circuit layer.

11. The method of claim 10, further comprising attaching an insulating board to the other surface of the carrier board prior to forming the insulating protective layer on the one surface of the carrier board.

12. The method of claim 10, wherein the patterned circuit layer is formed by the steps of forming a seed layer by electroless plating, forming a metal layer by electroplating, and forming the patterned circuit layer by photolithography and etching.

13. The method of claim 10, wherein the patterned circuit layer is formed by the steps of forming a seed layer by electroless plating, forming a patterned resistive layer on the seed layer, and forming the patterned circuit layer by electroplating.

14. The method of claim 10, further comprising forming a built-up structure on the dielectric layer, the built-up structure comprising at least one dielectric layer, at least one built-up circuit layer, a plurality of connecting pads, and a plurality of conductive vias electrically connected to the patterned circuit layer.

15. The method of claim 14, further comprising forming another insulating protective layer on the surface of the built-up circuit layer, and forming a plurality of openings in the insulating protective layer, to thereby expose the connecting pads of the built-up circuit layer.

16. The method of claim 10, wherein the bottom surface of each of the conductive vias is etched after the carrier board has been removed, so as to form a slight sinking structure.

17. The method of claim 10, further comprising forming a bump on the bottom surface of each of the conductive vias by a patterning process.

* * * * *